United States Patent
Damodaran et al.

(10) Patent No.: US 8,862,836 B2
(45) Date of Patent: Oct. 14, 2014

(54) MULTI-PORT REGISTER FILE WITH AN INPUT PIPELINED ARCHITECTURE WITH ASYNCHRONOUS READS AND LOCALIZED FEEDBACK

(75) Inventors: Raguram Damodaran, Plano, TX (US); Ramakrishnan Venkatasubramanian, Plano, TX (US); Naveen Bhoria, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 740 days.

(21) Appl. No.: 13/160,174

(22) Filed: Jun. 14, 2011

(65) Prior Publication Data

US 2012/0324175 A1 Dec. 20, 2012

(51) Int. Cl.
G06F 12/00 (2006.01)
G06F 13/00 (2006.01)
G06F 13/28 (2006.01)
G06F 5/00 (2006.01)

(52) U.S. Cl.
CPC ...................................... *G06F 5/00* (2013.01)
USPC .................................. 711/154; 711/E12.001

(58) Field of Classification Search
CPC ................ G06F 5/00; G06F 5/06; G06F 9/30
USPC .......................................... 711/154, E12.001
See application file for complete search history.

(56) References Cited

U.S. PATENT DOCUMENTS

| | | | | |
|---|---|---|---|---|
| 4,933,909 A | * | 6/1990 | Cushing et al. | 365/230.05 |
| 5,109,524 A | * | 4/1992 | Wagner et al. | 712/42 |
| 6,128,721 A | * | 10/2000 | Yung et al. | 712/23 |
| 6,567,340 B1 | * | 5/2003 | Nataraj et al. | 365/236 |
| 6,704,858 B1 | * | 3/2004 | Sugimoto | 712/228 |
| 7,681,917 B2 | * | 3/2010 | Guillo et al. | 280/743.2 |
| 8,468,335 B2 | * | 6/2013 | Lin et al. | 713/100 |
| 2011/0194370 A1 | * | 8/2011 | Shiu | 365/230.03 |
| 2012/0324174 A1 | * | 12/2012 | Damodaran et al. | 711/154 |

* cited by examiner

*Primary Examiner* — Sheng-Jen Tsai
(74) *Attorney, Agent, or Firm* — Robert D. Marshall, Jr.; Frederick J. Telecky, Jr.

(57) ABSTRACT

In an embodiment of the invention, a multi-port register file includes write port inputs (e.g. write address, write enable, data input) that are pipelined and synchronous and read port inputs (e.g. read address) that are asynchronous and are not pipelined. Because the write port inputs are pipelined, they are stored in pipelined registers. When data is written to the multi-port register file, data is first written to the pipelined registers during a first clock cycle. On the next clock cycle, data is read from the pipelined registers and written into memory array registers. Which bits of data from a pipelined synchronous data register are written into the multi-port register file is determined by a pipelined synchronous bit-write register. The output of the pipelined synchronous bit-write register selects which inputs of multiplexers contained in registers in the multi-port register file are stored.

19 Claims, 6 Drawing Sheets

TO FIG. 5B

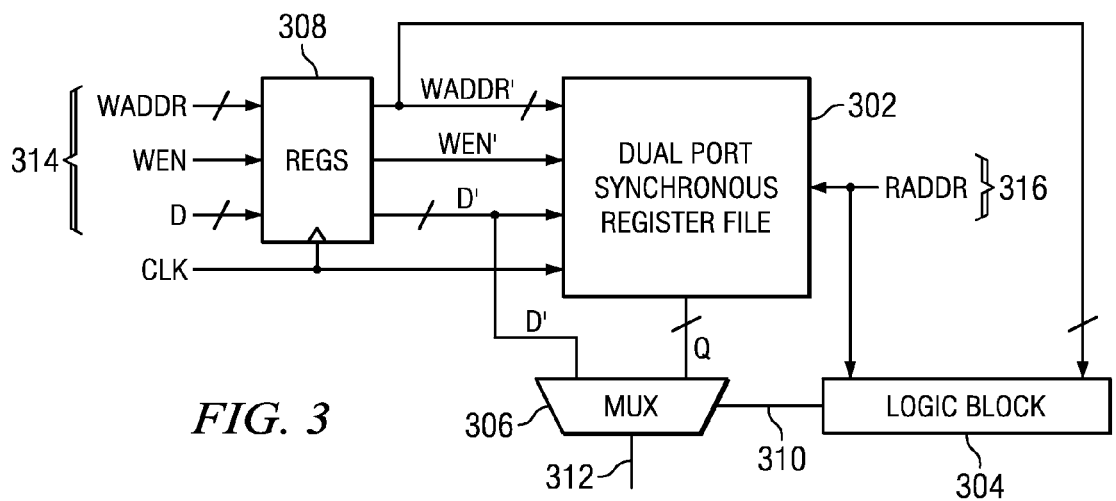
FIG. 3
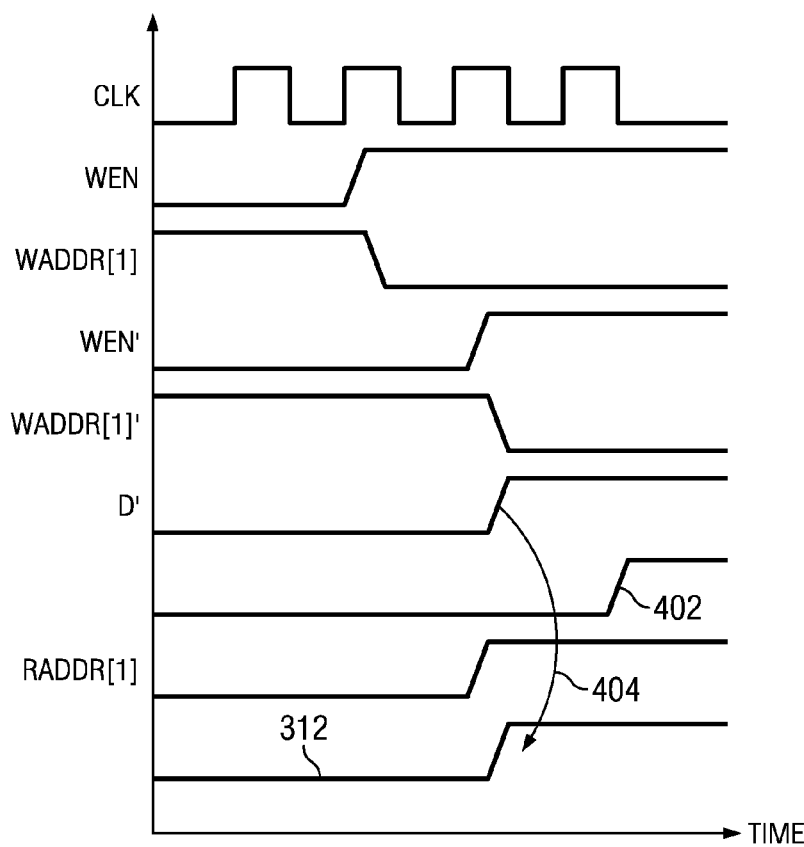
FIG. 4
FIG. 5A
FIG. 5B
FIG. 5

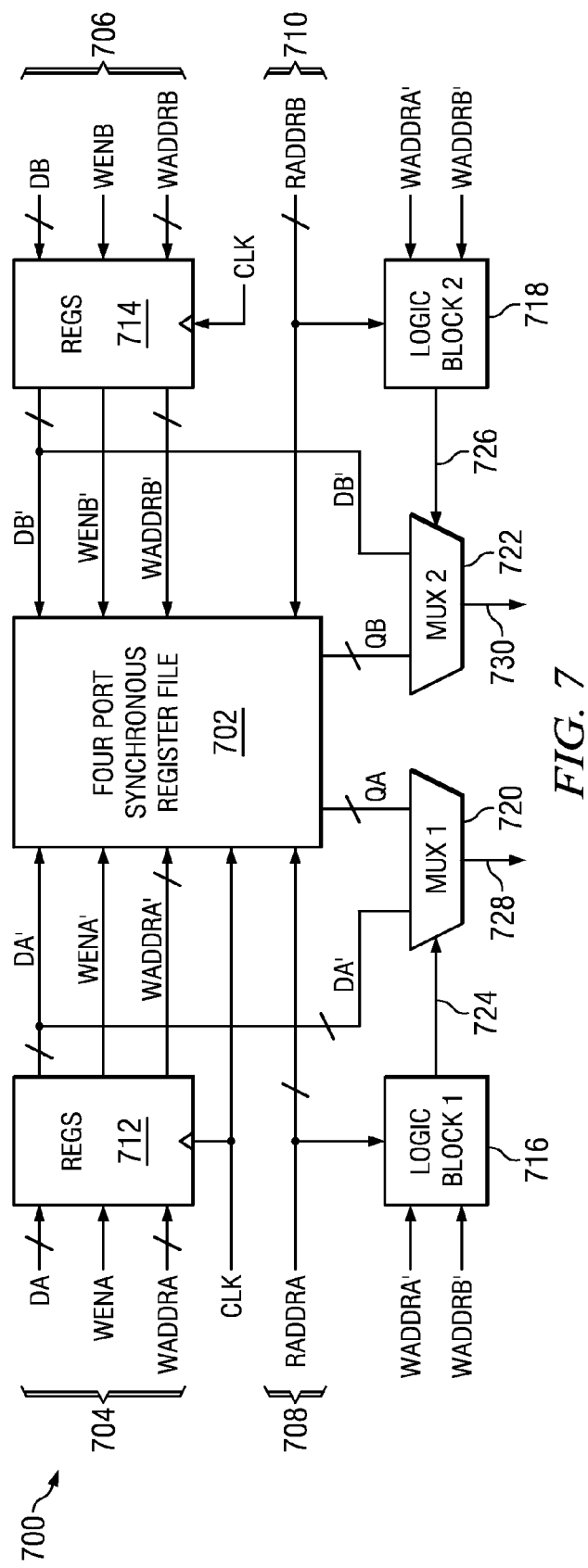
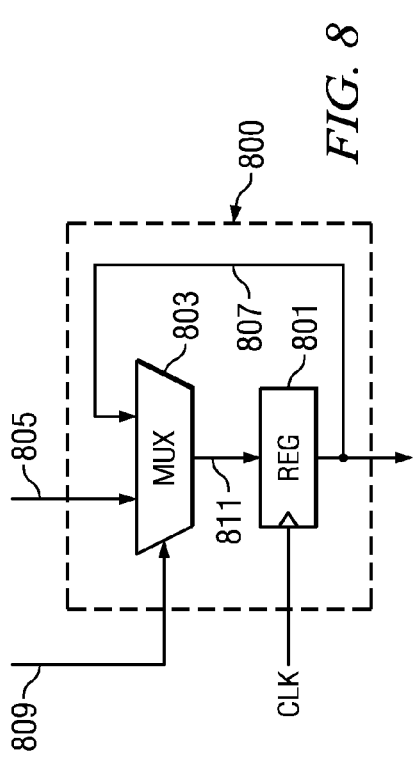
FIG. 7
FIG. 8

MULTI-PORT REGISTER FILE WITH AN INPUT PIPELINED ARCHITECTURE WITH ASYNCHRONOUS READS AND LOCALIZED FEEDBACK

CROSS-REFERENCED TO RELATED APPLICATIONS

This application is related to Ser. No. 13/160,156 entitled "Multi-port Register File with an Input Pipelined Architecture and Asynchronous Read Data Forwarding", filed on even date herewith and is hereby incorporated by reference for all that is disclosed therein.

BACKGROUND

A register file is an array of processor registers (registers) in a central processing unit (CPU). Registers are temporary storage locations inside the CPU that hold data and addresses. Modern registers found on integrated circuits (ICs) are usually implemented using fast static random access memory (SRAM) with multiple ports. These SRAMs are usually distinguished by having one or more dedicated read and write ports, whereas other SRAMs are usually read and written through the same port.

Multi-port registers usually have one word line per entry per port, one bit line per bit of width per read port, and two bit lines per bit of width per write port. The area of a register is often determined by the number of wordlines and bitlines (i.e. the number of read and write ports) used in a register. Therefore, the area of a register may increase as the square of the number of ports a register contains. At some point, it may be smaller and/or faster to have multiple redundant registers, with a smaller numbers of ports, than a single register file with all the ports.

The time needed to write data to a multi-port register is determined in part by address decode logic and any buffering needed for the inputs. The time needed to write data to a multi-port register may be reduced by removing buffering to the inputs and "pipelining" (pipelining will be explained in more detail below) the inputs to a register. However, pipelining inputs to a register may add more area to the register.

Often data from the output of a register file is feed back into registers contained in the register file. In order to feed back data from the output of the register file, conducting layers must be routed through the register file. Routing conducting layers through the register file may increase the area of the register file. Localized feedback may be used to reduce the area of a register file.

BRIEF DESCRIPTION OF THE DRAWINGS

FIG. 3 is a block diagram of an embodiment of a dual port (asynchronous read and synchronous write) input pipelined register file.

FIG. 4 is a timing diagram for an embodiment of a dual port (asynchronous read and synchronous write) input pipelined register file.

FIG. 7 is a block diagram of an embodiment of a four port (2 asynchronous read ports and 2 synchronous write ports) input pipelined register file.

FIG. 8 is a block diagram of an embodiment of a register in the memory array 502.

DETAILED DESCRIPTION

The drawings and description, in general, disclose a multi-port register file where the write port inputs (e.g. write address, write enable, data input) are synchronous and pipelined. The read port inputs (e.g. read addresses) in this example are asynchronous and are not pipelined. Because the write port inputs are pipelined, they are stored in pipelined registers that are not part of the memory array registers. When data is written to the multi-port register file, data is first written to the pipelined registers during a first clock cycle. On the next clock cycle, data is read from the pipelined registers and written into memory array registers and new data may be written (piped) into the pipelined registers.

Data is read from the multi-port register file asynchronously. A read occurs in the multi-port register file when a read address is presented to the read port of the multi-port register file. The read address is not stored in pipelined memory. In most cases, the read address is decoded and a row of memory array registers is selected and the data in the row of memory array registers is presented at the output of the multi-port register file.

Which bits of data from a pipelined synchronous data register are written into the multi-port register file is determined by a pipelined synchronous bit-write register. The output of the pipelined synchronous bit-write register selects which inputs of multiplexers contained in registers in the multi-port register file are stored. For example, when a multiplexer has two inputs, the pipelined synchronous bit-write register either selects data from the pipelined synchronous data register or feeds back the output of the register into the input of the register.

Figure 1:
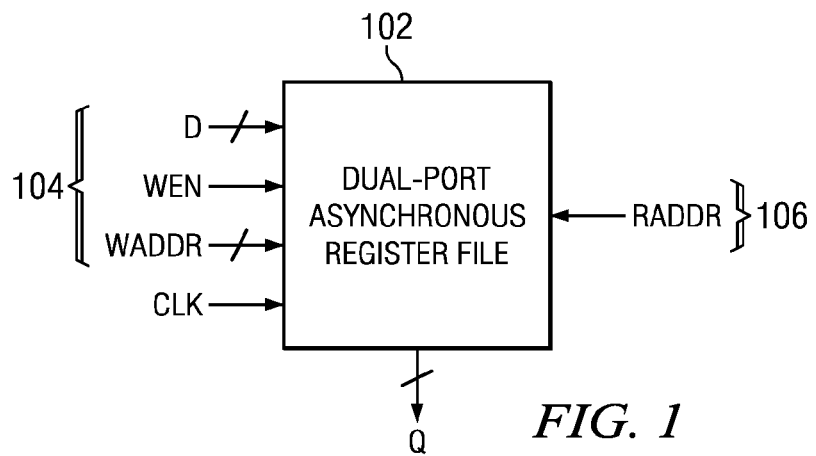
FIG. 1 is a block diagram of an embodiment of a dual port (asynchronous read and synchronous write) register file.

FIG. 1 is a block diagram of an embodiment of a dual port (asynchronous read and synchronous write) register file 102. In this embodiment of a dual port register file 102, the write port 104 includes a write enable bit WEN, a clock signal CLK, a multi-bit write address signal WADDR and multi-bit data signal D. In this embodiment of a dual port register file 102, the read port 106 includes multi-bit read address signal RADDR. The multi-bit output signal Q may be read from the dual port register file 102.

Figure 2:
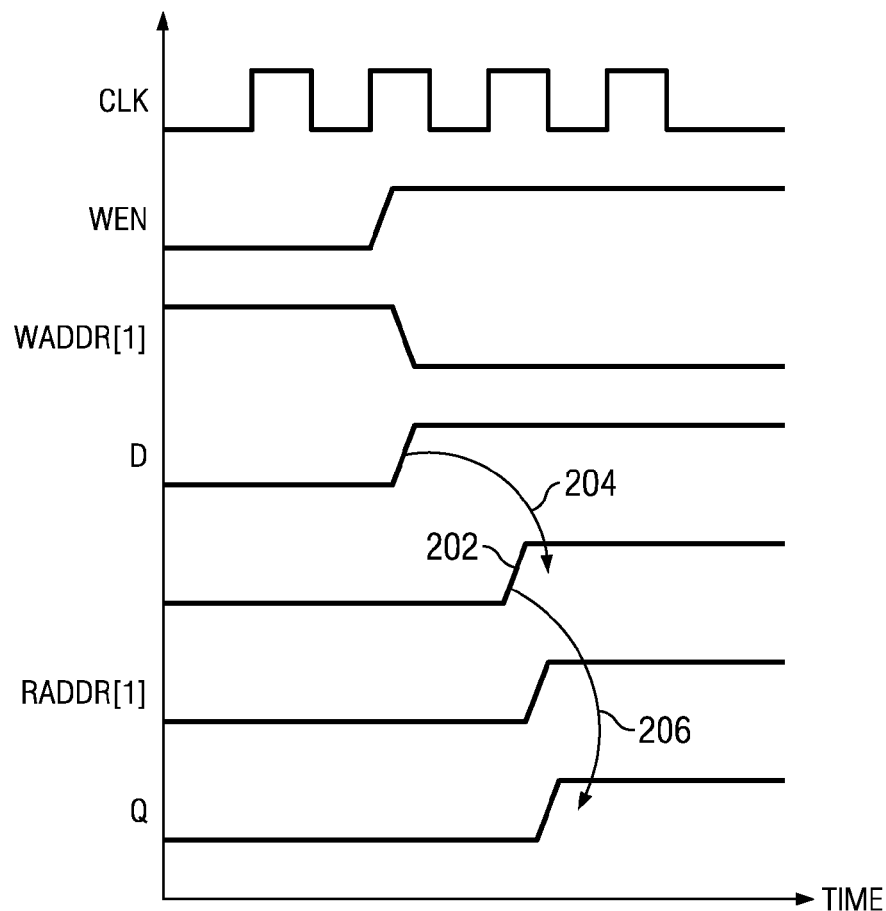
FIG. 2 is a timing diagram for an embodiment of a dual port (asynchronous read and synchronous write) register file.

FIG. 2 is a timing diagram for an embodiment of a dual port (asynchronous read and synchronous write) register file 102. In this example, when the write enable bit WEN changes from a logical zero to a logical one, the multi-bit data signal D may be written into the register file 102. WADDR[1] represents one bit of the multi-bit write address WADDR to illustrate the timing required for all the address bits. The multi-bit data signal D is then stored in the register file 102 at the location 202 given by the multi-bit write address WADDR.

After the multi-bit data signal is stored in the register file 102 at location 202, that location 202 may be read by providing a read address RADDR into the read port 106 that is identical to the write address WADDR. RADDR[1] represents one bit of the multi-bit read address RADDR to illustrate the timing required for all the address bits. When the identical RADDR is provided, the digital value of multi-bit data signal D is presented on the output Q. The arrows 204 and 206 represent the transfer of data to and from the register file 102.

A pipeline with respect to a computer is the continuous and somewhat overlapped movement of data to a processor. Pipelining is the use of a pipeline. Without a pipeline, a computer processor gets the first instruction from memory, performs the operation it calls for, and then goes to get the next instruction from memory. While fetching (getting) the instruction, the arithmetic part of the processor is idle. The processor usually has to wait until it gets the next instruction.

With pipelining, a computer architecture allows the next instructions to be fetched while the processor is performing arithmetic operations, holding them in a buffer close to the processor until each instruction operation can be performed. The staging of instruction fetching is continuous. The result is an increase in the number of instructions that can be performed during a given time period.

FIG. 3 is a block diagram of an embodiment of a dual port (asynchronous read and synchronous write) register file 302. The write port 314 in this example is pipelined. In this embodiment of a dual port register file 302, the write port 314 includes a write enable bit WEN, a multi-bit write address signal WADDR and multi-bit data signal D. The read port 316 includes multi-bit read address signal RADDR. The read port 316 is not pipelined. The multi-bit output signal 312 may be read from the dual port register file 302.

In the example shown in FIG. 3, the write port signals (WEN, WADDR and D) are stored in register 308 during a first clock cycle. All the write port signals are stored in register 308 for illustrative purposes. However, each write port signal may be stored in its own group of registers. Because the write port signals are stored in register 308, the write port signals are not presented to the dual port synchronous register file 302 until a second clock cycle. After the second clock cycle, the outputs (WADDR', WEN', D') of register 308 are presented to the dual port synchronous register file 302. The read address RADDR is asynchronous and is not stored in a register.

When word address WADDR' and RADDR are identical, logic block 304 selects input D' of multiplexer 306 to be output on node 312 of the multiplexer 306. This function is called data forwarding in a pipelined architecture. Data forwarding uses the data stored in register 308 rather than reading it from the output Q of dual port synchronous register file 302. Data forwarding allows data to be read one cycle earlier than it would have been otherwise. When word address WADDR' and RADDR are not identical, data is read from the output Q of the dual port synchronous register file 302.

FIG. 4 is a timing diagram for an embodiment of a dual port (asynchronous read and synchronous write) register file 302. In this example, the inputs, WADDR, WEN, and D, to the write port 314 are stored in register 308 on a first cycle of the clock CLK. On the next cycle of the clock CLK, the output of the register 308 are presented to the dual port synchronous register file 302. In this example, when the write enable bit WEN' changes from a logical zero to a logical one, the multi-bit data signal D' may be written into the register file 302. WADDR[1]' represents one bit of the multi-bit write address WADDR' to illustrate the timing required for all the address bits. The multi-bit data signal D' is then stored in the register file 302 at the location 402 given by the multi-bit write address WADDR'.

After the multi-bit data signal is stored in the register file 302 at location 402, that location 402 may be read by providing a read address RADDR into the read port 316 that is identical to the write address WADDR'. RADDR[1] represents one bit of the multi-bit read address RADDR to illustrate the timing required for all the address bits. When the identical RADDR is provided, the digital value of multi-bit data signal D is presented on the output Q.

In the example shown in FIG. 4, when word address WADDR' and RADDR are identical, logic block 304 selects input D' of multiplexer 306 to be output on node 312 of the multiplexer 306. Arrow 404 represents the transfer of data from register 308 to the output 312. Data is forwarded using the data stored in register 308 rather than waiting one clock cycle later to read it from location 402 in the dual port synchronous register file 302. Data forwarding allows data to be read one cycle earlier than it would have been otherwise. When word address WADDR' and RADDR are not identical, data is read from the output Q of the dual port synchronous register file 302.

Figure 5A:
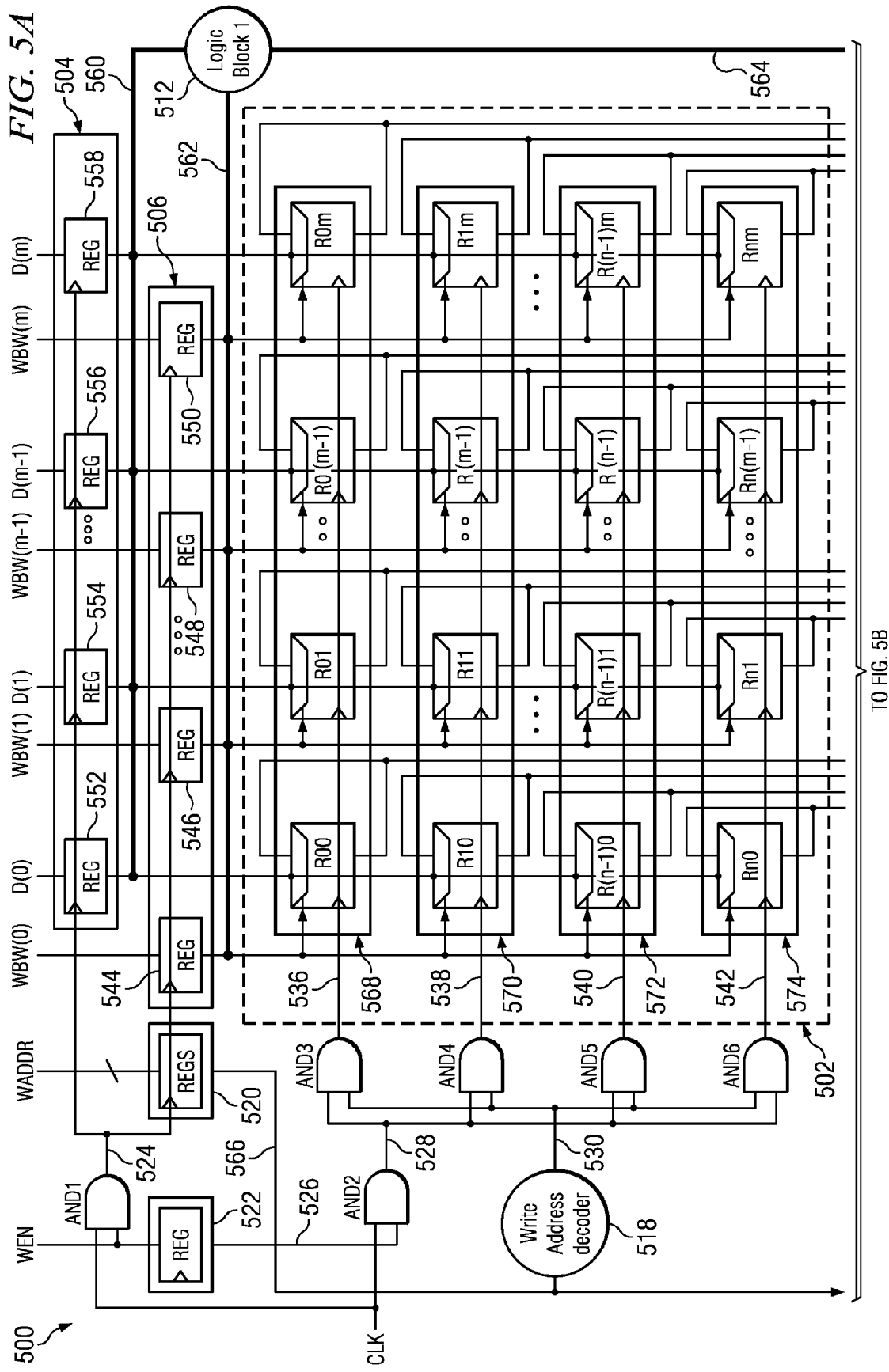
FIG. 5 is a block diagram of an embodiment of a dual port (asynchronous read and synchronous write) input pipelined register file.
Figure 5B:
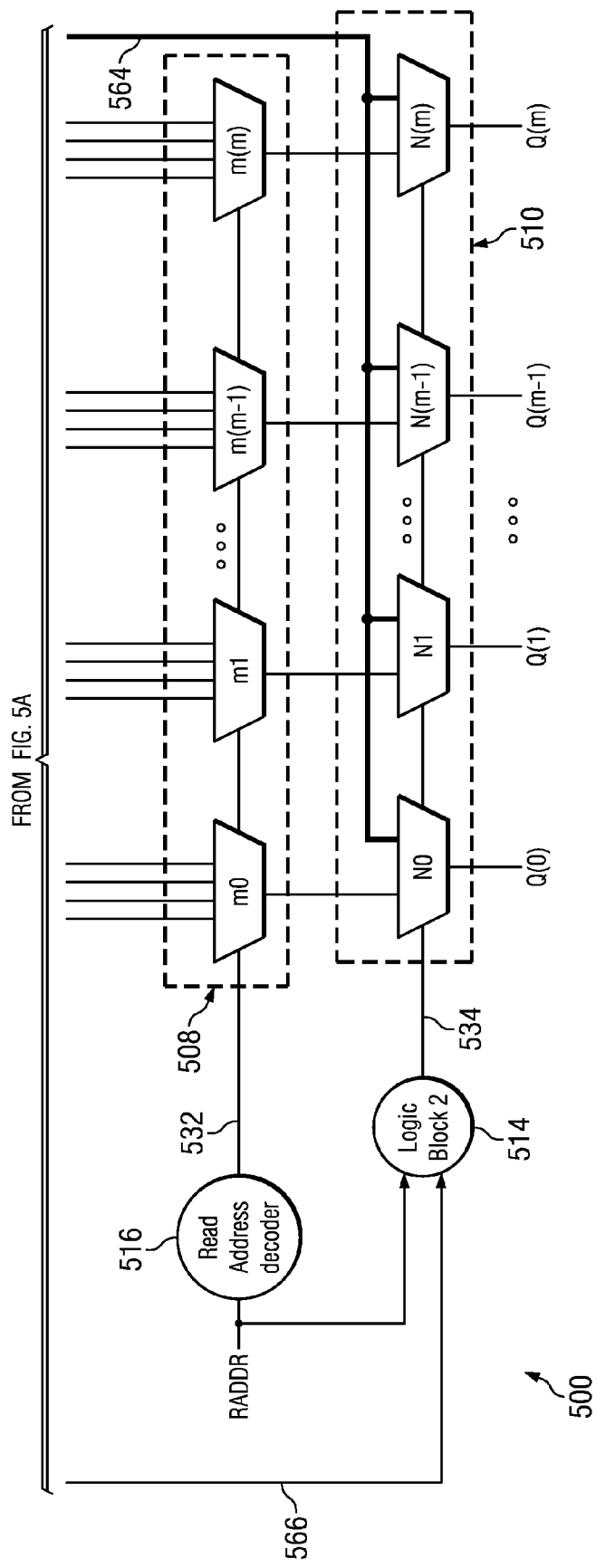

FIG. 5 is a block diagram of an embodiment of a dual port (asynchronous read and synchronous write) pipelined register file 500. In this embodiment, the write port includes pipelined synchronous data registers 504, pipelined synchronous bit-write registers 506, pipelined synchronous write address registers 520, and a pipelined synchronous write-enable register 526. The read port includes an asynchronous read address decoder 516. A write address decoder 518 decodes the output 566 of the pipelined synchronous write address registers 520 and selects which row (568-574) in the memory array 502 can be written to. A read address decoder 516 decodes the read address ADDR and selects which inputs of the read multiplexers 508 are transferred to the outputs of the read multiplexers 508.

Each register in the pipelined synchronous bit-write registers 506 determines whether an individual bit from pipelined synchronous data registers 504 is transferred to a register in the memory array 502. For example when the logical value stored in register 544 is a logical one, data may be transferred from register 552 in the pipelined synchronous data registers 504 into register R00 in the memory array. Each register (R00-RMN) in the memory array includes a multiplexer.

FIG. 8 is a block diagram of an embodiment of a register 800 in the memory array 502. The register includes a multiplexer 803 and a register 801. The output 811 of the multiplexer 803 is connected to the input of the register 801. The output 807 of the register 801 is connected to an input of the multiplexer 803. The other input 805 of the multiplexer 803 is connected to an output of the pipelined synchronous data registers 504. The select input 809 controls which input 805 or 807 is connected to the output 811 of the multiplexer 803. The select input 809 is provided by an output of a register from the pipelined synchronous bit-write registers 506.

The multiplexer 803 and register 801 may used together to form a standard cell (not shown) in a library of standard cells. A standard cell is a group of transistors and interconnect structures that provide a Boolean logic function or a storage function. The simplest cells are direct representations of the elemental NAND, NOR, and XOR Boolean function, although cells of much greater complexity are commonly used such as a 2-bit full-adder. Standard cells may be placed and routed by design automation tools to create a more complex function on an integrated circuit.

The multiplexer in each memory array register allows either data from a register in the pipelined synchronous data registers 504 to be transferred into the register or the multiplexer allows the output of the selected register in the memory array to be read back into the memory array register.

Because the pipelined synchronous bit-write registers 506 selects which bits from the pipelined synchronous data registers 504 are stored in memory array 502, different word sizes may be stored in the memory array 502. For example, a byte (4 bits), a word (8 bits) or a double word (16 bits) may be stored in the memory array 502.

Figure 6:
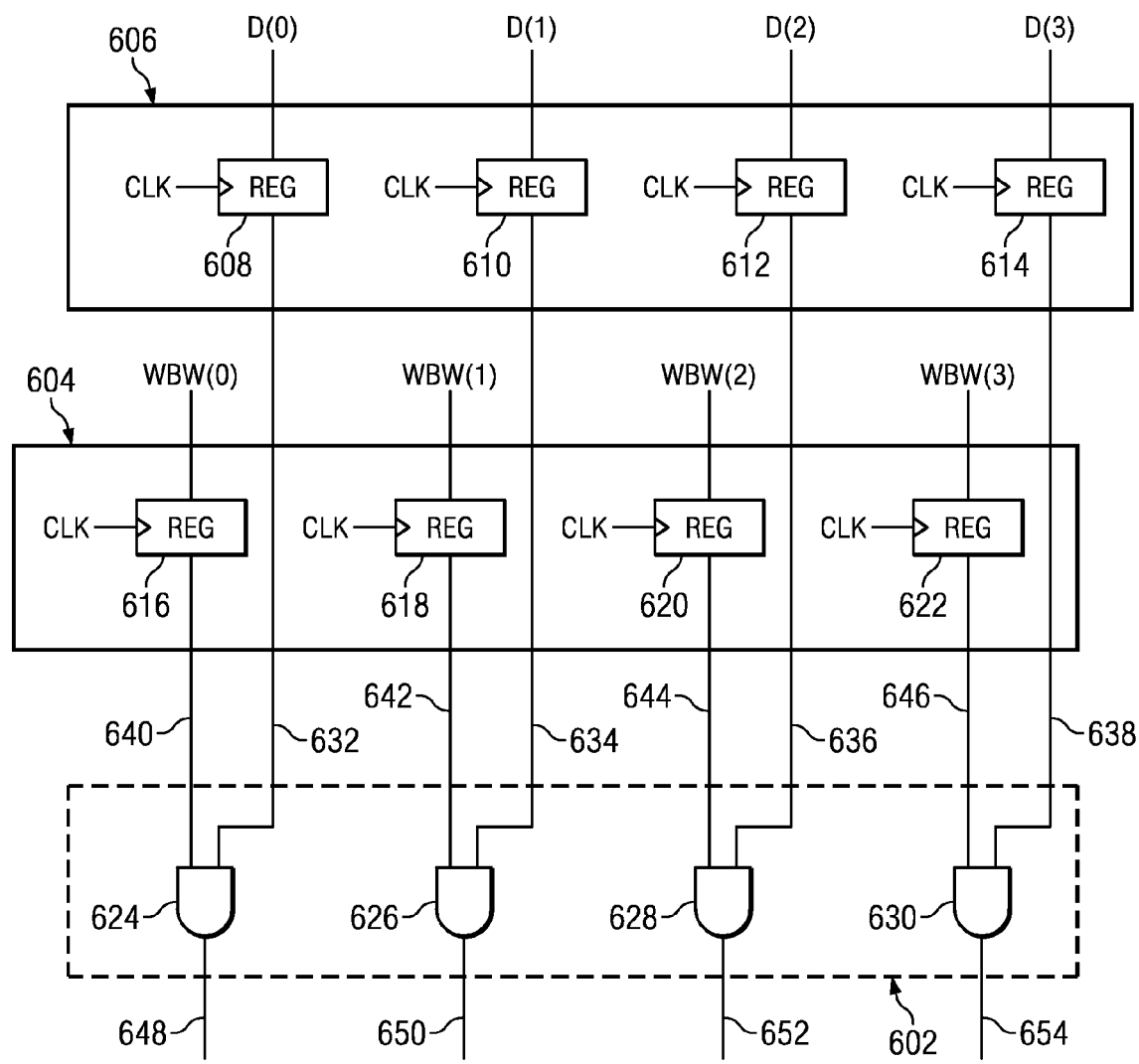
FIG. 6 is a schematic of an embodiment of a circuit for performing a bit-wise ANDing of two four-bit register blocks.

When the output 566 of the pipelined synchronous write address registers 520 is identical to the read address RADDR, the result of bit-wise ANDing of the pipelined synchronous data registers 504 and the pipelined synchronous bit-write registers 506 is transferred to the output (Q(0)-Q(m)) of the dual port pipelined register file 500. FIG. 6 is a schematic of an embodiment of a circuit for performing a bit-wise ANDing of two four-bit register blocks. In this embodiment, the outputs 640 and 632 of registers 616 and 608 respectively are "ANDED" by AND logic gate 624 with the result being 648. The outputs 642 and 634 of registers 618 and 610 respectively are "ANDed" by AND logic gate 626 with the result being 650. The outputs 644 and 636 of registers 620 and 612 respectively are "ANDED" by AND logic gate 628 with the result being 652. The outputs 646 and 638 of registers 622 and 614 respectively are "ANDED" by AND logic gate 630 with the result being 650.

When the output 566 of the pipelined synchronous write address registers 520 is identical to the read address RADDR, logic block 1 512 does a bit-wise AND function on the output 560 of the pipelined synchronous data registers 504 and the output 562 of the pipelined synchronous bit-write registers 506. The result 564 of the bit-wise AND operation is applied to inputs of the bit-wise multiplexers 510. When the output 566 of the pipelined synchronous write address registers 520 is identical to the read address RADDR, the result 564 of the bit-wise AND operation is transferred to the output (Q(0)-Q(m)) of the register file. When the output 566 of the pipelined synchronous write address registers 520 is not identical to the read address RADDR, data is transferred from the memory array 502 to the output (Q(0)-Q(m)) of the register file 500.

When the output 566 of the pipelined synchronous write address registers 520 is identical to the read address RADDR, data may be read one clock cycle earlier than it would have been if the pipelined synchronous write address registers 520 was not identical to the read address RADDR.

Power may be saved when no data (D(0)-D(m)) is being written to the register file 500. When the write enable signal WEN is low, the clock CLK can not be output from AND1 to node 524. Because the clock CLK can not be transferred to node 524, the registers 552, 554, 556 and 558 in the pipelined synchronous data registers 504 will not switch. Because the registers in the pipelined synchronous data registers 504 do not switch, switching power is saved.

When the write enable signal WEN is low, the clock CLK can not be output from AND1 to node 524. Because the clock CLK can not be transferred to node 524, the registers 544, 546, 548 and 550 in the pipelined synchronous bit-write registers 506 will not switch. Because the registers in the pipelined synchronous bit-write registers 506 do not switch, switching power is saved.

When the write enable signal WEN is low, the clock CLK can not be output from AND1 to node 524. Because the clock CLK can not be transferred to node 524, the registers in the pipelined synchronous write address registers 520 will not switch. Because the registers in the pipelined synchronous write address registers 520 do not switch, switching power is saved.

When the write enable signal WEN is low, the clock CLK can not be output from AND2 to node 528. Because the clock CLK can not be transferred to node 528, AND3, AND4, AND5 and AND6 can not output a clocked signal to nodes 536, 538, 540 and 542 respectively. Because nodes 536, 538, 540 and 542 can not output a clocked signal, rows 568 570, 572 and 574 respectively will not switch. Because rows 568 570, 572 and 574 do not switch, switching power is saved in the memory array 502.

Though not shown in FIG. 5, the pipelined synchronous data registers 504 and the pipelined synchronous bit-write registers 506 may be configured such that only the bits (i.e. a byte, a word, a double word) written to the pipelined synchronous data registers 504 and the pipelined synchronous bit-write registers 506 will switch. Because only these bits switch when they are being written, switching power may be saved.

FIG. 7 is a block diagram of an embodiment of a four port (2 asynchronous read ports and 2 synchronous write ports) input pipelined register file 700. The two write ports 704 and 706 in this example are pipelined. The write port 704 includes a write enable bit WENA, a multi-bit write address signal WADDRA and multi-bit data signal DA. The write port 706 includes a write enable bit WENB, a multi-bit write address signal WADDRB and multi-bit data signal DB. The read ports 708 and 710 include multi-bit read addresses RADDRA and RADDRB respectively. The read ports 708 and 710 are not pipelined. The multi-bit output signals 728 and 730 may be read from the four port input pipelined register file 700.

In the example shown in FIG. 7, the write port signals WENA, WADDRA and DA are stored in register 712 during a first clock cycle. The write port signals WENB, WADDRB and DB are stored in register 714 during a first clock cycle All the write port signals are stored in registers 712 and 714 for illustrative purposes. However, each write port signal may be stored in its own group of registers. Because the write port signals are stored in registers 712 and 714, the write port signals are not presented to the four port synchronous register file 702 until a second clock cycle. After the second clock cycle, the outputs (WADDRA', WENA', DA') of register 712 and the outputs (WADDRB', WENB', DB') of register 714 are presented to the four port synchronous register file 702. The read addresses RADDRA and RADDRB are asynchronous and are not stored in registers.

In the example shown in FIG. 3, when word address WADDRA' or WADDRB' is identical to RADDRA, logic block 716 selects input DA' of multiplexer 720 to be output on node 728 of the multiplexer 720. This function is called data forwarding in a pipelined architecture. Data forwarding uses the data stored in either register 712 or 714 rather than reading it from the output QA of four port synchronous register file 702. Data forwarding allows data to be read one cycle earlier than it would have been otherwise. When word address either WADDRA' or WADDRB' is not identical to RADDRA, data is read from the output QA of the four port synchronous register 302.

When word address WADDRA' or WADDRB' is identical to RADDRB, logic block 718 selects input DB' of multiplexer 722 to be output on node 730 of the multiplexer 722. This function is called data forwarding in a pipelined architecture. Data forwarding uses the data stored in either register 712 or 714 rather than reading it from the output QB of four port synchronous register file 702. Data forwarding allows data to be read one cycle earlier than it would have been otherwise. When word address either WADDRA' or WADDRB' is not identical to RADDRB, data is read from the output QA of the four port synchronous register 302.

FIG. 7 illustrates the use of two read ports and two write ports. However, any number of read ports and writes ports may be used with a multiport input synchronous register file that uses data forwarding.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A dual port register file comprising:
a clock signal;
a memory array comprising:
    a group of rows of memory array registers;
    wherein each memory array register in the memory array comprises:
        a multiplexer, the multiplexer having first and second data inputs, a select input and a data output;
        a memory cell, the memory cell having a data input connected to the output of the multiplexer, a data output connected to the second data input of the multiplexer and an input connected to the clock signal;
synchronous write address decode logic having inputs and outputs, wherein the synchronous write address decode logic outputs select which row from the group of rows of memory array registers data is written;
a write port, the write port comprising:
    pipelined synchronous data registers having inputs and outputs wherein the outputs of the pipelined synchronous data registers are connected to the first data inputs of the memory array registers;
    pipelined synchronous bit-write registers having inputs and outputs wherein outputs of the pipelined synchronous bit-write registers select which data inputs of the multiplexers are written to the inputs of the memory cells;
    pipelined synchronous write address registers having inputs and outputs wherein the outputs are electrically connected to the inputs of the write address decode logic, wherein the pipelined synchronous write address registers store a write address;
    a pipelined synchronous write-enable register, wherein the pipelined synchronous write-enable register selects when the data from the pipelined synchronous data registers is written to the memory array;
a read port, the read port comprising an asynchronous read address;
asynchronous read address decode logic having inputs and outputs wherein the outputs from the asynchronous read address decode logic select which row of memory array registers is read from the memory array, wherein an asynchronous read address is electrically connected to the inputs of the asynchronous read address decode logic.

2. The dual port register file of claim 1 wherein when the pipelined synchronous write-enable register does not select data to be written, the pipelined synchronous data registers do not switch.

3. The dual port register file of claim 1 wherein when the pipelined synchronous write-enable register does not select data to be written, the pipelined synchronous bit-write registers do not switch.

4. The dual port register file of claim 1 wherein when the dual port register file writes a byte, only registers in the synchronous data registers that contain the byte switch.

5. The dual port register file of claim 1 wherein when the dual port register file writes a word, only registers in the synchronous data registers that contain the word switch.

6. The dual port register file of claim 1 wherein when the dual port register file writes a double-word, only registers in the synchronous data registers that contain the double-word switch.

7. The dual port register file of claim 1 wherein the memory array register is a standard cell.

8. A dual port register file comprising:
a clock signal;
a memory array comprising:
    a group of rows of memory array registers;
    wherein each memory array register in the memory array comprises:
        a multiplexer, the multiplexer having first and second data inputs, a select input and a data output;
        a memory cell, the memory cell having a data input connected to the output of the multiplexer, a data output connected to the second data input of the multiplexer and an input connected to the clock signal;
synchronous write address decode logic having inputs and outputs, wherein the synchronous write address decode logic outputs select which row from the group of rows of memory array registers data is written;
a write port, the write port comprising:
    pipelined synchronous data registers having inputs and outputs wherein the outputs of the pipelined synchronous data registers are connected to the first data inputs of the memory array registers;
    pipelined synchronous bit-write registers having inputs and outputs wherein outputs of the pipelined synchronous bit-write registers select which data inputs of the multiplexers are written to the inputs of the memory cells;
    pipelined synchronous write address registers having inputs and outputs wherein the outputs are electrically connected to the inputs of the write address decode logic, wherein the pipelined synchronous write address registers store a write address;
    a pipelined synchronous write-enable register, wherein the pipelined synchronous write-enable register selects when the data from the pipelined synchronous data registers is written to the memory array;
a read port, the read port comprising an asynchronous read address;
asynchronous read address decode logic having inputs and outputs, wherein an asynchronous read address is electrically connected to the inputs of the asynchronous read address decode logic;
array multiplexers, the array multiplexers having data inputs, select inputs and outputs, wherein the select inputs of the array multiplexers select which data inputs of the array multiplexers are presented on the output of the array multiplexers;
wherein outputs from the asynchronous read address decode logic are electrically connected to the select inputs of the array multiplexers;
read data-forwarding multiplexers, the read data-forwarding multiplexers having select inputs, first data inputs, second data inputs and outputs wherein the first data inputs of the read data-forwarding multiplexers are electrically connected to the outputs of the array multiplexers;
wherein the second data inputs of the read data-forwarding multiplexers are electrically connected to a result of a bit-wise ANDing of the output from the pipelined synchronous data registers and the output from the pipelined synchronous bit-write registers.

9. The dual port register file of claim 8 wherein when the pipelined synchronous write-enable register does not select data to be written, the pipelined synchronous data registers do not switch.

10. The dual port register file of claim 8 wherein when the pipelined synchronous write-enable register does not select data to be written, the pipelined synchronous bit-write registers do not switch.

11. The dual port register file of claim 8 wherein when the dual port register file writes a byte, only registers in the synchronous data registers that contain the byte switch.

12. The dual port register file of claim 8 wherein when the dual port register file writes a word, only registers in the synchronous data registers that contain the word switch.

13. The dual port register file of claim 8 wherein when the dual port register file writes a double-word, only registers in the synchronous data registers that contain the double-word switch.

14. A four port register file comprising:
   a clock signal;
   a memory array comprising:
      a group of rows of memory array registers;
      wherein each memory array register in the memory array comprises:
         a multiplexer, the multiplexer having first, second, and third data inputs, a select input and an output;
         a memory cell, the memory cell having a data input connected to the output of the multiplexer, a data output connected to the third data input of the multiplexer and an input connected to the clock signal;
   a first synchronous write address decoder having inputs and outputs, wherein the first synchronous write address decoder outputs select which row from the group of rows of memory array registers a first group of data is written;
   a first write port, the first write port comprising:
      a first group of pipelined synchronous data registers having inputs and outputs wherein the outputs of the first group of pipelined synchronous data registers are connected to the first data inputs of the memory array registers;
      a first group of pipelined synchronous bit-write registers having inputs and outputs wherein outputs of the pipelined synchronous bit-write registers select which data inputs of the multiplexers are written to the inputs of the memory cells;
      a first group of pipelined synchronous write address registers having inputs and outputs wherein the outputs are electrically connected to the inputs of the write address decode logic, wherein the pipelined synchronous write address registers store a first write address;
      a first pipelined synchronous write-enable register, wherein the first pipelined synchronous write-enable register selects when the data from the first group of pipelined synchronous data registers is written to the memory array;
   a first read port, the first read port comprising a first asynchronous read address;
   a first asynchronous read address decoder having inputs and outputs wherein the outputs from the asynchronous read address decoder select which row of memory array registers is read from the memory array, wherein a first asynchronous read address is electrically connected to the inputs of the first asynchronous read address decoder;
   a second synchronous write address decoder having inputs and outputs, wherein the second synchronous write address decoder outputs select which row from the group of rows of memory array registers a second group of data is written;
   a second write port, the second write port comprising:
      a second group of pipelined synchronous data registers having inputs and outputs wherein the outputs of the second group of pipelined synchronous data registers are connected to the second data inputs of the memory array registers;
      a second group of pipelined synchronous bit-write registers having inputs and outputs wherein outputs of the second group of pipelined synchronous bit-write registers select which data inputs of the multiplexers are written to the inputs of the memory cells;
      a second group of pipelined synchronous write address registers having inputs and outputs wherein the outputs are electrically connected to the inputs of the write address decode logic, wherein the pipelined synchronous write address registers store a first write address;
      a second pipelined synchronous write-enable register, the second pipelined synchronous write-enable register selects when the data is written to the memory array;
   a second read port, the second read port comprising a second asynchronous read address
   a second asynchronous read address decoder having inputs and outputs wherein the outputs from the second asynchronous read address decoder select which row of memory array registers is read from the memory array, wherein a second asynchronous read address is electrically connected to the inputs of the second asynchronous read address decoder.

15. The four port register file of claim 14 wherein when the first pipelined synchronous write-enable register does not select data to be written, the first group of pipelined synchronous data registers do not switch.

16. The four port register file of claim 14 wherein when the first pipelined synchronous write-enable register does not select data to be written, the first group of pipelined synchronous bit-write registers do not switch.

17. The four port register file of claim 14 wherein when the four port register file writes a byte, only registers in the first group of synchronous data registers that contain the byte switch.

18. The four port register file of claim 14 wherein when the four port register file writes a word, only registers in the first group of synchronous data registers that contain the word switch.

19. The four port register file of claim 14 wherein when the four port register file writes a double-word, only registers in the first group of synchronous data registers that contain the double-word switch.

* * * * *